United States Patent
Boselli et al.

(10) Patent No.: US 7,348,643 B2
(45) Date of Patent: Mar. 25, 2008

(54) SEMICONDUCTOR DUAL GUARDRING ARRANGEMENT

(75) Inventors: Gianluca Boselli, Farmers Branch, TX (US); Charvaka Duvvury, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/447,359

(22) Filed: Jun. 6, 2006

(65) Prior Publication Data

US 2007/0278581 A1    Dec. 6, 2007

(51) Int. Cl.
 *H01L 29/76* (2006.01)
(52) U.S. Cl. .................... 257/409; 257/355; 257/362
(58) Field of Classification Search ............... 257/409, 257/355, 362
See application file for complete search history.

(56) References Cited

U.S. PATENT DOCUMENTS

| | | | |
|---|---|---|---|
| 5,045,913 A | * | 9/1991 | Masleid et al. ............. 257/409 |
| 6,900,969 B2 | * | 5/2005 | Salling et al. ................ 361/56 |
| 6,940,131 B2 | | 9/2005 | Baldwin et al. |
| 2005/0007216 A1 | | 1/2005 | Baldwin et al. |

* cited by examiner

*Primary Examiner*—Douglas M. Menz
(74) *Attorney, Agent, or Firm*—W. James Brady, III; Frederick J. Telecky, Jr.

(57) ABSTRACT

A semiconductor dual guardring arrangement is provided which is useful during electrostatic discharge (ESD) events as well as during normal operating conditions. In particular, an inner guard that is located closer to an active area provides desirable performance during normal operating conditions, while an outer guardring located further from the active area provides desirable performance during an ESD event.

20 Claims, 2 Drawing Sheets

SEMICONDUCTOR DUAL GUARDRING ARRANGEMENT

FIELD OF INVENTION

The present invention relates generally to the art of semiconductor devices, and more particularly to a dual guardring arrangement that is useful during both electrostatic discharge (ESD) events as well as during normal operating conditions.

BACKGROUND OF THE INVENTION

Electrostatic discharge (ESD) is a continuing problem in the design, manufacture and utilization of semiconductor devices. Integrated circuits (ICs) can be damaged by ESD events stemming from a variety of sources, in which large currents flow through the device in an uncontrolled fashion. In one such ESD event, a packaged IC acquires a charge when it is held by a human whose body is electrostatically charged. An ESD event occurs when the IC is inserted into a socket, and one or more of the pins of the IC package touch the grounded contacts of the socket. This type of event is known as a human body model (HBM) ESD stress. For example, a charge of about 0.6 µC can be induced on a body capacitance of 150 pF, leading to electrostatic potentials of 4 kV or greater. HBM ESD events can result in a discharge for about 100 nS with peak currents of several amperes to the IC. Another source of ESD is from metallic objects, known as the machine model (MM) ESD source, which is characterized by a greater capacitance and lower internal resistance than the HBM ESD source. The MM ESD model can result in ESD transients with significantly higher rise times than the HBM ESD source. A third ESD model is the charged device model (CDM), which involves situations where an IC becomes charged and discharges to ground. In this model, the ESD discharge current flows in the opposite direction in the IC than that of the HBM ESD source and the MM ESD source. CDM pulses also typically have very fast rise times compared to the HBM ESD source.

ESD events typically involve discharge of current between one or more pins or pads exposed to the outside of an integrated circuit chip. Such ESD current flows from the pad to ground through vulnerable circuitry in the IC, which may not be designed to carry such currents. Many ESD protection techniques have been thusfar employed to reduce or mitigate the adverse effects of ESD events in integrated circuit devices. Many conventional ESD protection schemes for ICs employ peripheral dedicated circuits to carry the ESD currents from the pin or pad of the device to ground by providing a low impedance path thereto. In this way, the ESD currents flow through the protection circuitry, rather than through the more susceptible circuits in the chip.

Such protection circuitry is typically connected to I/O and other pins or pads on the IC, wherein the pads further provide the normal circuit connections for which the IC was designed. Some ESD protection circuits carry ESD currents directly to ground, and others provide the ESD current to the supply rail of the IC for subsequent routing to ground. Rail-based clamping devices can be employed to provide a bypass path from the IC pad to the supply rail (e.g., VDD) of the device. Thereafter, circuitry associated with powering the chip is used to provide such ESD currents to the ground. Local clamps are more common, wherein the ESD currents are provided directly to ground from the pad or pin associated with the ESD event. Individual local clamps are typically provided at each pin on an IC, with the exception of the ground pin or pins.

SUMMARY OF THE INVENTION

The following presents a simplified summary in order to provide a basic understanding of some aspects of the invention. This summary is not an extensive overview of the invention. It is intended to neither identify key or critical elements of the invention nor to delineate the scope of the invention. Rather, the primary purpose of this summary is to present some concepts of the invention in a simplified form as a prelude to the more detailed description that is presented later.

A semiconductor dual guardring arrangement is provided which is useful during electrostatic discharge (ESD) events as well as during normal operating conditions. In particular, an inner guardring that is located closer to an active area provides desirable performance during normal operating conditions, while an outer guardring located further from the active area provides desirable performance during an ESD event.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
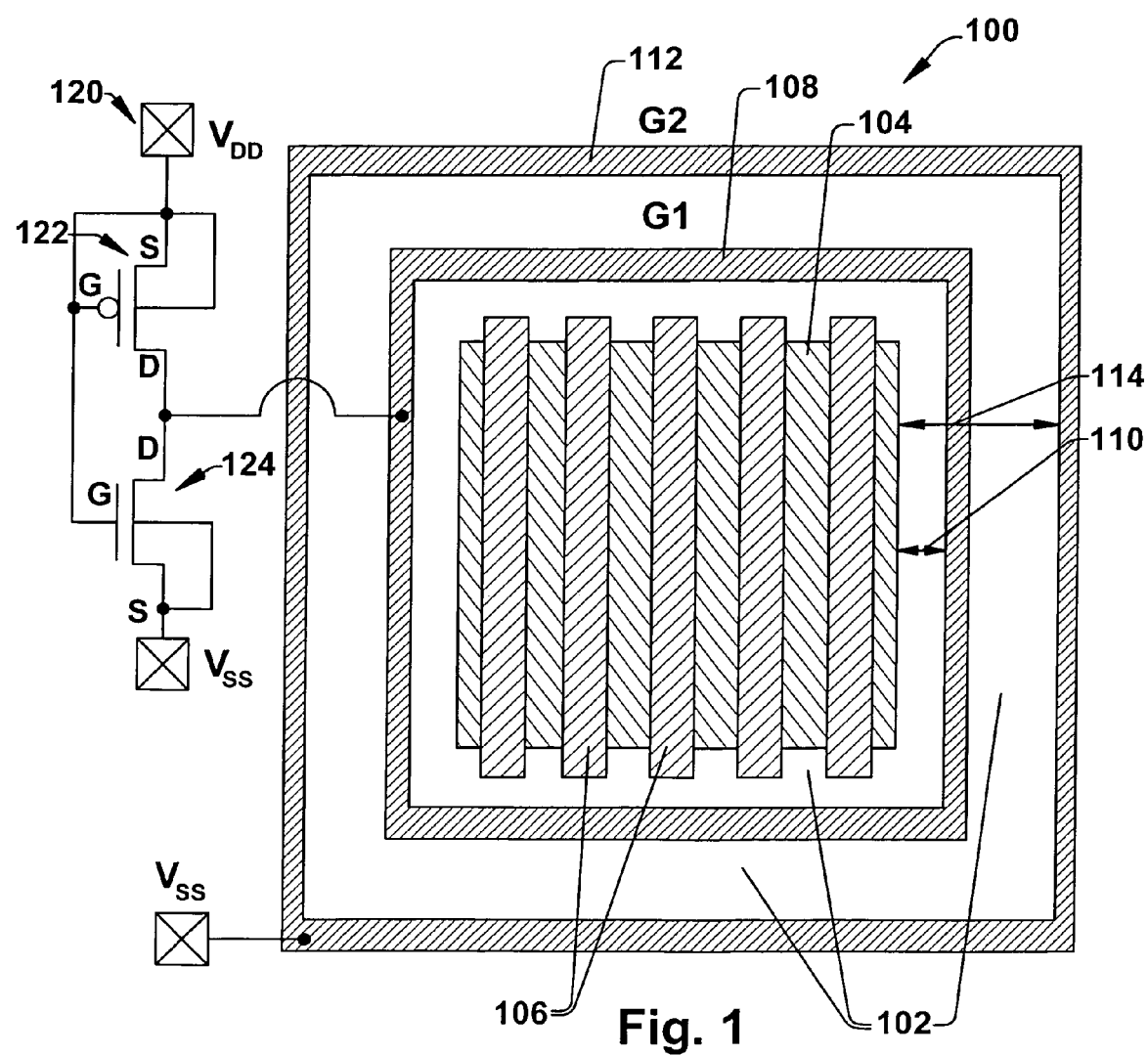
FIG. 1 is a schematic diagram illustrating an exemplary dual guardring arrangement suitable for use with one or more NMOS transistors.

One or more examples are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more examples. It may be evident, however, to one skilled in the art that one or more examples may be practiced with a lesser degree of these specific details. In other instances, known structures and devices are illustrated to facilitate describing one or more examples.

Turning to FIG. 1, an exemplary dual guardring arrangement 100 is illustrated that is suitable for use with one or more NMOS transistors. The illustration is a top view of the arrangement 100, which is formed on a semiconductor substrate 102, where the substrate 102 may comprise any type of semiconductor body (e.g., silicon, SiGe, SOI) such as a semiconductor wafer or one or more die on a wafer, as well as any other type of semiconductor and/or epitaxial layers grown thereon and/or otherwise associated therewith. Since the illustrated arrangement 100 has application to one or more NMOS transistors, the illustrated portion of the substrate 102 may be doped to have a p type electrical conductivity, such that the arrangement 100 can be said to be formed in a p type well in the substrate 102.

An active area 104 is centrally located in the arrangement 100. The active area 104 comprises a region of the substrate 102 wherein one or more semiconductor devices can be formed. As such, since this arrangement has application to NMOS devices, the active area 104 is doped to have an n type electrical conductivity, and can thus be said to comprise an n type well. Additionally, one or more regions of electrically conductive material 106, such as patterned polysilicon, for example, are formed over the active area 104 to serve as, at least part of, one or more NMOS transistor gates, for example.

A first guardring 108 is formed in the substrate 102 around the active area 104 and the conductive regions 106. The first guardring 108 is doped to have p type electrical conductivity. The guardring 108 generally extends down to a subsurface or underlying substrate layer, such as a backgate region of the one or more NMOS transistors, for example. The first guardring 108 is situated relatively close to the active area 104 to satisfy normal operating requirements. Although the distance 110 between the first guardring 108 and the active area 104 may be technology dependent, the first guardring 108 and the active area 104 are generally separated by a distance 110 of between about 0.25 and about 1.5 microns, for example.

A second guardring 112 is formed in the substrate 102 around the first guardring 108. Like the first guardring 108, the second guardring 112 comprises an area of the substrate 102 that is doped to have a p type electrical conductivity. The second guardring 112 also generally extends down to a subsurface or underlying substrate layer, such as a backgate region of the one or more NMOS transistors, for example. The second guardring 112 is distanced away from the active area 104 to satisfy requirements during an ESD event. The second guardring 112 and the active area 104 are generally separated by a distance 114 of between about 2.5 and about 25 microns, for example.

A schematically illustrated inverter 120 is operatively coupled to the first guardring 108. The inverter 120 comprises first and second transistors 122, 124, where the gates (G) of the transistors are coupled to a first voltage Vdd, which generally comprises a supply voltage. The source (S) of the first transistor 122 is also coupled to the supply voltage Vdd, while the source (S) of the second transistor 124 is coupled to second voltage Vss, which generally corresponds to ground. The respective drains (D) of the first 122 and second 124 transistors are operatively coupled to the first guardring 108. The second guardring 112 is operatively coupled to the second voltage Vss.

As previously mentioned, the first or inner guardring 108 operates during normal operating conditions, while the second or outer guardring 112 becomes operational during an ESD event. The first guardring 108 serves as a tap or input/output buffer for the n well active area 104 by inhibiting hot carriers and/or other undesirable particles or contaminants from entering into and exiting out of the active area 104. The distance 110 between the first guardring 108 and the active area 104 is accordingly kept small to minimize any such adverse effects. For example, keeping the first guardring 108 close to the one or more NMOS transistors that are touching pads mitigates well/ground bounce effects wherein well or ground voltages can be inadvertently changed. This orientation also mitigates noise injection where noise can be undesirably introduced into the circuitry. This orientation further facilitates appropriate latch up robustness whereby desired current flow is generated within and/or between devices.

The distance 114 between the first guardring 108 and the active area 104 is kept large, on the other hand, to facilitate desired operation during ESD events. For example, during ESD conditions it is desirable to have tap guardrings placed far from the one or more NMOS transistors touching the pads. During human body model (HBM) ESD events, for example, locating the guardring far from the devices facilitates increased resistance from the substrate 102 which is beneficial for the uniform conduction of the one or more NMOS transistors being protected. Similarly, during charged device model (CDM) ESD events the separation between the guardring 108 and the devices facilitates enhanced gate to bulk oxide breakdown.

By way of further example, during normal operation Vdd is applied to the respective gates of the first 122 and second 124 transistors of the inverter 120. As such, the first guardring 108 is pulled down to Vss through the connection to the respective drains of the devices 122,124. As a result, both guardrings 108 and 112 are at Vss which is desirable for normal operating conditions. During an ESD event, however, Vdd is floating such that the respective drains of the first 122 and second 124 transistors of the inverter 120 are floating as well. As such, the first guardring 108 floats accordingly due to the coupling to the respective drains of the devices 122 and 124. Thus, merely the second or outer guardring 112 is connected during an ESD event, which is desirable for the reasons described above.

Figure 2:
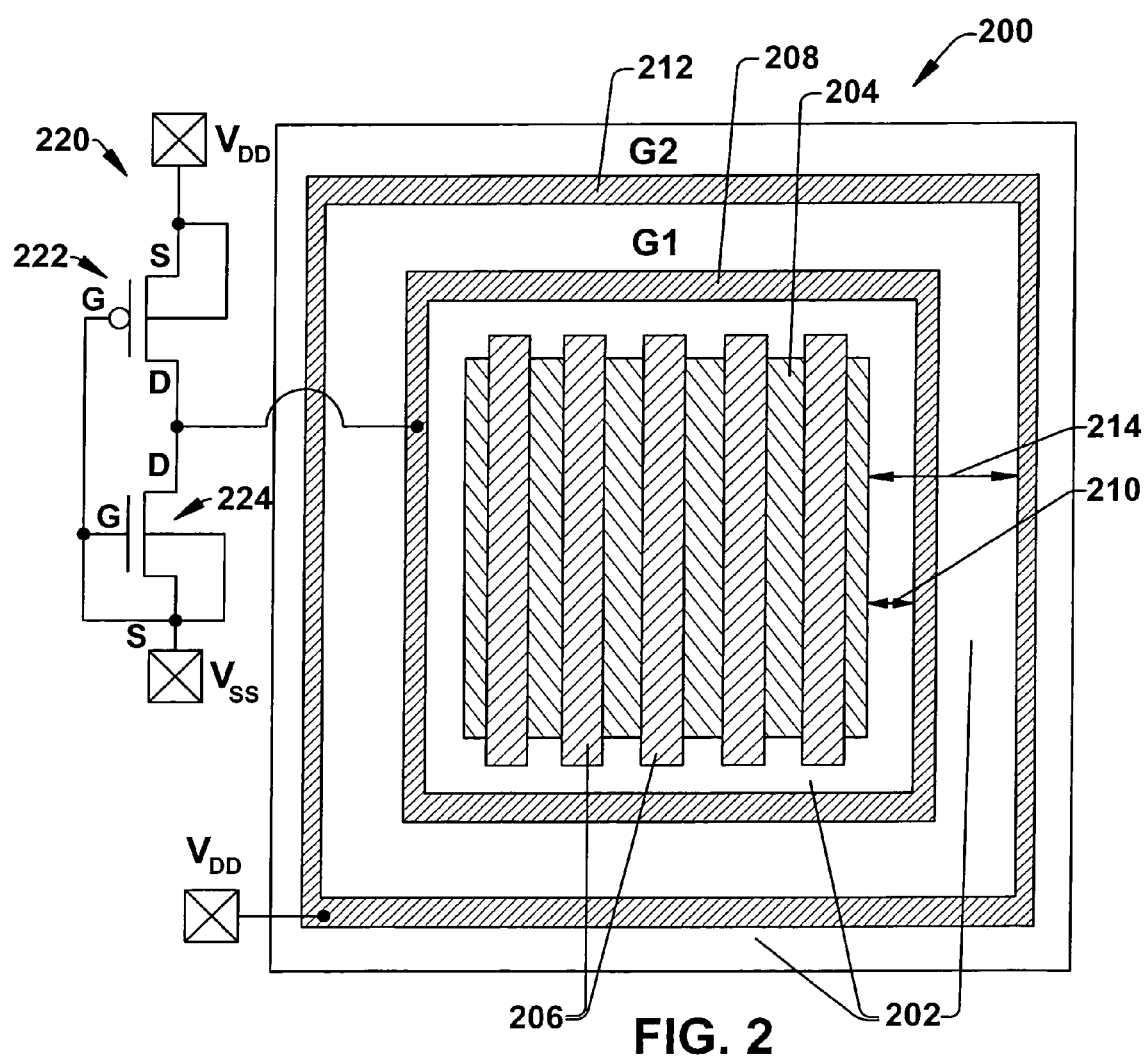
FIG. 2 is a schematic diagram illustrating an exemplary dual guardring arrangement suitable for use with one or more PMOS transistors.

Turning to FIG. 2, an exemplary dual guardring arrangement 200 is illustrated that is suitable for use with one or more PMOS transistors. The illustration is similar to that depicted in FIG. 1, except that electrical conductivities are reversed/opposite. Accordingly, the substrate 202 may be doped to have an n type electrical conductivity, such that the arrangement 200 can be said to be formed in an n type well in the substrate 202.

An active area 204 is centrally located in the arrangement 200. The active area 204 comprises a region of the substrate 202 wherein one or more semiconductor devices can be formed. As such, since this arrangement has application to PMOS devices, the active area 204 is doped to have a p type electrical conductivity, and can thus be said to comprise a p type well. Additionally, one or more regions of electrically conductive material 206, such as patterned polysilicon, for example, are formed over the active area 204 to serve as, at least part of, one or more PMOS transistor gates, for example.

A first guardring 208 is formed in the substrate 202 around the active area 204 and the conductive regions 206. The first guardring 208 is doped to have and n type electrical conductivity. The guardring 208 generally extends down to a subsurface or underlying substrate layer, such as a backgate region of the one or more PMOS transistors, for example. As with the arrangement illustrated in FIG. 1, the first guardring 208 is situated relatively close to the active area 204 to satisfy normal operating requirements. In particular, the first guardring 208 and the active area 204 are generally separated by a distance 210 of between about 0.25 and about 2.5 microns, for example.

A second guardring 212 is formed in the substrate 202 around the first guardring 208. Like the first guardring 208, the second guardring 212 comprises an area of the substrate 202 that is doped to have an n type electrical conductivity. The second guardring 212 also generally extends down to a subsurface or underlying substrate layer, such as a backgate region of the one or more PMOS transistors, for example. The second guardring 212 and the active area 204 are generally separated by a distance 214 of between about 2.5 and about 25 microns, for example.

A schematically illustrated inverter 220 is operatively coupled to the first guardring 208. The inverter 220 comprises first and second transistors 222, 224, where the source (S) of the first transistor 222 is coupled to a first voltage Vdd, which generally comprises a supply voltage. The source (S) of the second transistor 224 is coupled to a second voltage Vss, which generally corresponds to ground. The respective gates (G) of the transistors 222, 224 are also coupled to Vss. The respective drains (D) of the first 222 and second 224 transistors are operatively coupled to the first guardring 208. The second guardring 212 is operatively coupled to the source voltage Vdd.

As with the NMOS related arrangement 100 illustrated in FIG. 1, the first or inner guardring 208 operates during normal operating conditions, while the second or outer guardring 212 becomes operational during an ESD event. During normal operation, the application of Vss to the gates of the first 222 and second 224 transistors causes Vdd to be at the respective drains of the transistors 222, 224 such that the first guardring 208 is pulled up to the Vdd through the connection to the drains of the devices 222, 224. As a result, both guardrings 208 and 212 are at Vdd which is desirable for normal operating conditions. During an ESD event, however, Vdd is floating such that the respective drains of the first 222 and second 224 transistors of the inverter 220 are floating as well. As such, the first guardring 208 floats accordingly due to the coupling to the respective drains of the devices 222 and 224. Thus, merely the second or outer guardring 212 is connected during an ESD event, which is desirable for the reasons set forth above.

Although the invention has been shown and described with respect to one or more examples, equivalent alterations, modifications and/or implementations may occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. Further, while the guardrings and other features have been illustrated as being substantially square or rectangular, they are not intended to be limited to these exact shapes.

What is claimed is:

1. A semiconductor protecting arrangement, comprising:
a first guardring formed in a semiconductor substrate, the first guardring having a first electrical conductivity type and surrounding an active area of the substrate that has a second electrical conductivity type;
a second guardring formed in the substrate, the second guardring having the first electrical conductivity type and surrounding the first guardring, the second guardring being coupled to a first voltage; and
an inverter operatively coupled to the first guardring, the inverter causing the first guardring to be at the first voltage during normal operating conditions and to float during an ESD event.

2. The arrangement of claim 1, wherein the substrate has the first electrical conductivity type.

3. The arrangement of claim 2, where one or more regions of electrically conductive material are formed over the active area.

4. The arrangement of claim 3, where the first guardring and the active area are separated by a distance of between about 0.25 and about 2.5 microns.

5. The arrangement of claim 1, where the first guardring and the active area are separated by a distance of between about 0.25 and about 2.5 microns.

6. The arrangement of claim 4, where the second guardring and the active area are separated by a distance of between about 2.5 and about 25 microns.

7. The arrangement of claim 1, where the second guardring and the active area are separated by a distance of between about 2.5 and about 25 microns.

8. The arrangement of claim 6, where the inverter comprises first and second transistors, the respective gates of the first and second transistors being coupled to a second voltage, the respective drains of the first and second transistors being coupled to the first guardring, the source of the first transistor being coupled to the second voltage and the source of the second transistor being coupled to the first voltage.

9. The arrangement of claim 8, where the first voltage comprises a ground voltage and the second voltage comprises a supply voltage.

10. The arrangement of claim 6, where the inverter comprises first and second transistors, the respective gates of the first and second transistors being coupled to a second voltage, the respective drains of the first and second transistors being coupled to the first guardring, the source of the first transistor being coupled to the first voltage and the source of the second transistor being coupled to the second voltage.

11. The arrangement of claim 10, where the first voltage comprises a supply voltage and the second voltage comprises a ground voltage.

12. The arrangement of claim 1, where the inverter comprises first and second transistors, the respective gates of the first and second transistors being coupled to a second voltage, the respective drains of the first and second transistors being coupled to the first guardring, the source of the first transistor being coupled to the second voltage and the source of the second transistor being coupled to the first voltage.

13. The arrangement of claim 12, where the first voltage comprises a ground voltage and the second voltage comprises a supply voltage 14. The arrangement of claim 1, where the inverter comprises first and second transistors, the respective gates of the first and second transistors being coupled to a second voltage, the respective drains of the first and second transistors being coupled to the first guardring, the source of the first transistor being coupled to the first voltage and the source of the second transistor being coupled to the second voltage.

15. The arrangement of claim 14, where the first voltage comprises a supply voltage and the second voltage comprises a ground voltage.

16. An NMOS dual guardring arrangement comprising:
a p type first guardring formed in a p type semiconductor substrate, the first guardring surrounding an n type active area of the substrate;
a p type second guardring formed in the substrate, the second guardring surrounding the first guardring, the second guardring being coupled to a first voltage; and
an inverter operatively coupled to the first guardring, the inverter causing the first guardring to be at the first voltage during normal operating conditions and to float during an ESD event.

17. The arrangement of claim 16, where at least one of the first guardring and the active area are separated by a distance of between about 0.25 and about 2.5 microns, and
the second guardring and the active area are separated by a distance of between about 2.5 and about 25 microns.

18. The arrangement of claim 17, where the inverter comprises first and second transistors, the respective gates of the first and second transistors being coupled to a second voltage, the respective drains of the first and second transistors being coupled to the first guardring, the source of the first transistor being coupled to the second voltage and the source of the second transistor being coupled to the first voltage.

19. A PMOS dual guardring arrangement comprising:
an n type first guardring formed in an n type semiconductor substrate, the first guardring surrounding a p type active area of the substrate;
an n type second guardring formed in the substrate, the second guardring surrounding the first guardring, the second guardring being coupled to a first voltage; and
an inverter operatively coupled to the first guardring, the inverter causing the first guardring to be at the first voltage during normal operating conditions and to float during an ESD event.

20. The arrangement of claim 19, where at least one of the first guardring and the active area are separated by a distance of between about 0.25 and about 2.5 microns,
the second guardring and the active area are separated by a distance of between about 2.5 and about 25 microns, and
the inverter comprises first and second transistors, the respective gates of the first and second transistors being coupled to a second voltage, the respective drains of the first and second transistors being coupled to the first guardring, the source of the first transistor being coupled to the first voltage and the source of the second transistor being coupled to the second voltage.

\* \* \* \* \*